United States Patent [19]

Heuber et al.

[11] 4,070,656
[45] Jan. 24, 1978

[54] READ/WRITE SPEED UP CIRCUIT FOR INTEGRATED DATA MEMORIES

[75] Inventors: Klaus Heuber, Boeblingen; Wilfried Klein, Holzgerlingen; Knut Najmann, Gaertringen; Siegfried Kurt Wiedmann, Stuttgart, all of Germany

[73] Assignee: International Business Machines Corporation, Armonk, N.Y.

[21] Appl. No.: 739,669

[22] Filed: Nov. 8, 1976

[30] Foreign Application Priority Data

Dec. 17, 1975   Germany .............................. 2556833

[51] Int. Cl.² .................... G11C 11/40; G11C 7/00
[52] U.S. Cl. ............................ 365/203; 340/173 FF;
365/154; 365/204; 365/233
[58] Field of Search .................. 340/173 FF, 173 DR,
340/173 R

[56] References Cited

U.S. PATENT DOCUMENTS 3,736,572   5/1972   Tu .................................. 340/173 DR

Primary Examiner—Terrell W. Fears
Assistant Examiner—Donald McElheny
Attorney, Agent, or Firm—Wesley De Bruin

[57] ABSTRACT

An improved method of operating a monolithic memory together with novel and efficient circuitry for practicing said improved method is disclosed. In a bipolar transistor store, or monolithic memory, in accordance with the invention, a very low current (first level) flows from the load elements to the internal cell nodes in the stand-by mode. During the initial portion of a read cycle, current flows from the bit lines to the cell nodes, in addition to the stand-by current (second level). In the recovery period of the read cycle or write cycle a short pulse is added to the stand-by current (third level), thereby reducing the recovery time. The practice of the invention provides a monolithic memory having minimal power requirements and a substantially reduced cycle time.

16 Claims, 8 Drawing Figures

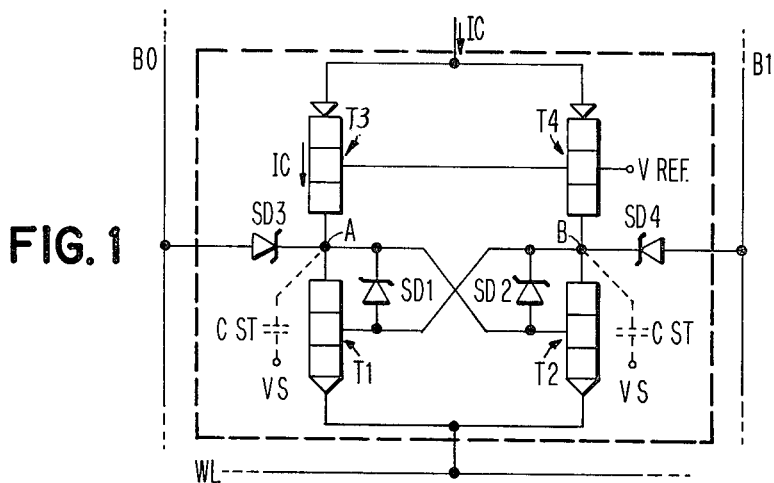
FIG. 1
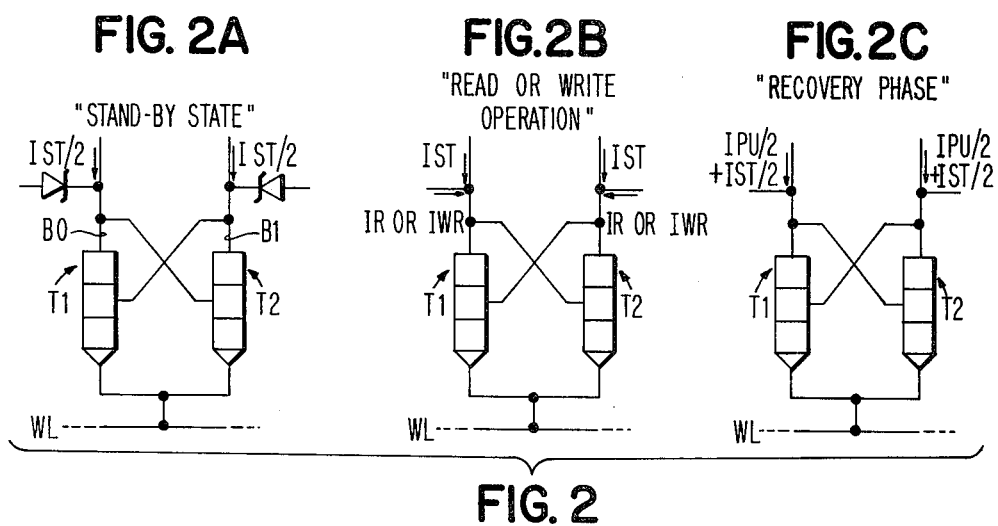
FIG. 2A
"STAND-BY STATE"
FIG. 2B
"READ OR WRITE OPERATION"
FIG. 2C
"RECOVERY PHASE"
FIG. 2
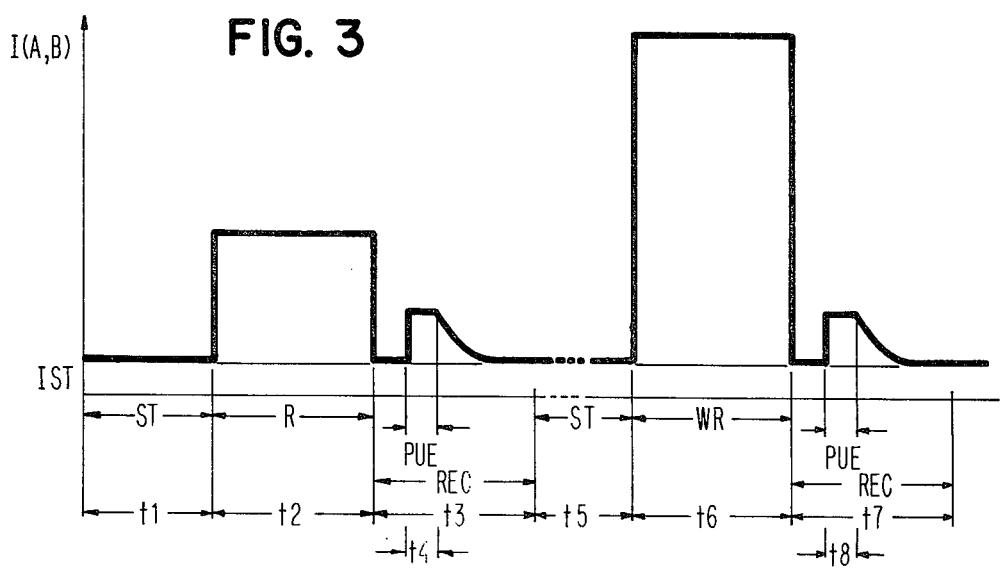
FIG. 3

READ/WRITE SPEED UP CIRCUIT FOR INTEGRATED DATA MEMORIES

The above abstract is not to be taken either, as a complete exposition or as a limitation of the present invention, the full nature and extent of the invention being discernible only by reference to and from the entire disclosure.

CROSS REFERENCE TO RELATED APPLICATIONS AND PATENTS

Reference is made to U.S. Pat. No. 4,023,148, Ser. No. 635,538 entitled "Write Speed-Up Circuit for Integrated Data Memories", filed Nov. 26, 1975 by Klaus Heuber, Wilfried Klein, Knut Najmann and Siegfried K. Wiedmann and of common assignee herewith.

The abstract of U.S. Pat. No. 4,023,148 reads as follows:

"Modern bipolar cross coupled memory cells for high density arrays use diodes as coupling elements from the cell to the bit lines. The write operation of these cells requires a high amount of current if the current gain of the cell transistors is high. The time required to perform a write operation is prolonged significantly due to the inherent capacitors in the cell known as the Miller effect. The described circuit completely eliminates the Miller effect during the write operation and makes the required write current completely independent of the current gain of the cell transistors".

"In the present invention (U.S. Pat. No. 4,023,148) this is accomplished by dropping the word line of such a cell from a stand-by potential to a select potential, so that the inner cell nodes are equally discharged, without disturbing the state of the cell, after which the word line is pulsed up to an intermediate potential between the select potential and the stand-by potential".

Reference is made to U.S. Patent application Ser. No. 662,309 entitled "Method of AND Circuit Arrangement for Operating A Semiconductor Memory System", filed Mar. 1, 1976, by Horst H. Berger, Klaus Hueber, Wilfried Klein, Knut Najmann and Siegfried K. Wiedmann, and of common assignee herewith.

The abstract of Patent Application Ser. No. 662,309 reads as follows:

"The invention Ser. No. 662,309) relates to a method of, and a circuit arrangement for, operating the read/write cycles of an integrated semiconductor memory storage system whose storage cells consist of flip flops with bipolar switching transistors, Schottky diodes as read/write elements coupling the cell to the bit lines, and high resistivity resistors or transistors controlled as current sources, as load elements, in several phases".

"This is accomplished through coupling the storage cell to both read/write circuits and restore/recovery circuits via the bit lines and by selective pulsing of the cell with the read/write circuits and the restore/recovery circuits".

Reference is made to U.S. Pat. No. 3,505,573 entitled "Low Standby Power Memory Cell" granted Apr. 7, 1970 to Siegfried K. Wiedmann on Application Ser. No. 763,870, filed Sept. 30, 1968 and of common assignee herewith.

The abstract of U.S. Pat. No. 3,505,573 reads as follows:

"A monolithic memory cell formed by a pair of dual emitter transistors in a bistable circuit configuration, the cell being powered in a high current mode sufficient to maintain the circuit during operating periods, and a low current mode sufficient to main the circuit during storage intervals. The cell includes a pair of transistors formed in a substrate of a first conductivity type. The transistors comprise a pair of base regions in the substrate of a conductivity type opposite that of the substrate. A pair of diffused emitters is contained within each base region. The region of the substrate surrounding each base provides the collector for each of said transistors. The low current mode is provided by a constant power source applied to the collector regions through high resistivity substrate. A second power source is selectively applied to the collector regions through a low resistivity, opposite conductivity type region in the substrate intermediate the pair of transistors. The junction of the intermediate region and the substrate proper acts as a diode to switch the current being applied to the collector to the high current from the second source through the parallel low resistivity path".

Reference is made to U.S. Pat. No. 3,693,057 entitled "Monolithic Circuits with Pinch Resistors", granted Sept. 19, 1972 to Siegfried K. Wiedmann on application Ser. No. 127,751, filed Mar. 24, 1971 and of common assignee herewith.

U.S. Pat. No. 3,693,057 is directed to a monolithic power switching flip flop circuit comprising a pair of cross-coupled transistors, each having a "pinch" resistor formed in one common substrate. Each pinch resistor comprises a resistor and a diode connected to each other at one terminal, the second terminal of the resistor being connected to the base of a respective transistor and the other terminal of the diode being connected to the collector of said transistor through the bulk semiconductor material of the common substrate. By suitable external electrical connections, the resistor portion of each pinch resistor is connected in parallel with the diode portion of the other pinch resistor. Thus, each resistor is shunted by a diode and placed in the collector circuit of a respective transistor to form the electrical circuit equivalent of a conventional power switching flip-flop utilizing minimum bulk semiconductor material.

Reference is made to U.S. Pat. No. 3,949,385, entitled "D.C. Stable Semiconductor Memory Cell" granted Apr. 6, 1976 to George Sonoda on application Ser. No. 535,464, filed Dec. 23, 1974, and of common assignee herewith.

Set-forth below is an excerpt from U.S. Pat. No. 3,949,385 which may be considered a summary of the disclosure thereof.

"A semiconductor memory array of four device FET cells is provided. Word lines and bit lines are arranged orthogonally in a known manner to permit accessing and sensing of information within an individual desired memory cell. Restoring means for equalizing or precharging the potential on a pair of bit lines is also provided. In addition to the foregoing, there is provided an array biasing means. The array bias means includes transistor means to provide a bit line and word line bias at a potential level intermediate between the full logical up and down levels".

Reference is made to U.S. Pat. No. 3,986,173, application Ser. No. 620,590 entitled "Memory Circuit" filed Oct. 8, 1975 by Utz Baitinger, Knut Najmann, and Werner Haug, and of common assignee herewith.

The abstract of U.S. Pat. No. 3,986,173 reads as follows:

"A semiconductor storage circuit for use in monolithic memories. The circuit is comprised of a storage cell coupled to input-output bit lines through active devices having symetrical conduction properties. The storage cell can be comprised of a pair of cross coupled bipolar transistors having resistors as collector load devices. Schottky field effect transistors (MESFET's) are active devices having symmetrical conduction properties".

"The entire circuit of the invention is readily created in integrated form in semiconductor wafers using existing processes".

BACKGROUND OF THE INVENTION

1. Field of the Invention

The invention relates to a method of, and a circuit arrangement for powering a semiconductor store, wherein the actual flip-flop transistors of the storage cells are comprised of bipolar transistors and the supply voltage, or current of which, is applied in the form of pulses in several phases.

2. Description of the Prior Art

Reference is made to U.S. Pat. No. 3,540,007 entitled "Field Effect Transistor Memory Cell" granted Nov. 10, 1970 to D. A. Hodges on Application Ser. No. 676,491, filed Oct. 19, 1967, and assigned to the Bell Telephone Laboratories, Inc.

The abstract of U.S. Pat. No. 3,540,007 reads as follows:

"A cross-coupled flip-flop stage, or memory cell, for a word oriented array of memory cells is developed from four insulated-gate field-effect transistors which perform storage, loading, and gating functions of the cell. The functions of the cell are controlled by three different voltage levels coupled by a word line to all cells of a memory word.

Associated with the array are bipolar transistor word-line-select and digit-write circuits used for achieving a low select-read-write cycle time for the memory cells".

Method of and circuit arrangements for powering storage cells whose load elements and flip-flop transistors comprise bipolar transistors are known. Also known are read/write coupling elements in the form of Schottky diodes. Thus, for example, U.S. patent application Ser. No. 662,309 (fully identified supra) describes a method of operating an integrated semiconductor store, generally of the type disclosed and described herein, in which the read/write cycles are performed in several phases, characterized in that for selecting a storage cell, a word line is pulsed to a lower level, causing the level of the bit line connected to the conductive transistor of the storage cell to be also pulled down to a lower level, whereas the level of the other bit line is raised slightly, so that the difference between the two bit line levels is sensed in a differential amplifier, that subsequently the storage cell is deselected by raising the potential on the word line as well as by applying a recovery current, so that the inner storage cell nodes are charged to a potential which in the form of a stand-by potential minus voltage drop is applied across a Schottky diode, and that the storage cell nodes are charged until one of the bit lines has reached a potential corresponding to the magnitude of the potential applied, and that finally the bit lines are returned to a common stand-by potential by switching on a voltage. The circuit arrangement in accordance with the disclosure of U.S patent application Ser. No. 662,309, for controlling the recovery and the restore phase in a read or a write cycle, is connected to the bit lines of the storage cells.

Although the storage density of highly integrated bipolar semiconductor stores can be increased substantially, this entails the problem of having to reduce the stand-by current still further at higher bit densities on the semiconductor chip. The actual read or write operations present no greater problems, although the cycle time of the store is substantially limited by the low cell current. In the case of the circuit arrangement and the method described and disclosed in U.S. patent application Ser. No. 622,309, the cell nodes are recharged relatively too slow as a result of the low currents.

SUMMARY OF THE INVENTION

Therefore, it is the primary object of the invention to provide a method of, and circuit arrangement for powering a monolithic store with bipolar transistors serving both as load elements and flip-flop transistors , wherein the store comprises Schottky diodes as bit line coupling elements and wherein in spite of the very low stand-by cell current, the cycle time is substantially reduced.

The solution, in accordance with the invention, may be seen from the summary of the invention as set forth in the following numbered paragraphs, 1 through 5.

1. A method of powering a semiconductor store, wherein the actual flip-flop transistors and the load elements of the storage cells comprise bipolar transistors and the supply voltage, or current of which, is applied in several phases. The method being characterized in that a stand-by current flowing after reading or writing in a read or write cycle subdivided into two phases is increased for a very short time by a current during a recovery phase, so that the cell nodes of the storage cells recover rapidly, and that at the end of the recovery phase the increased current again drops to the stand-by current.

2. A method of powering a semiconductor store in accordance with the method recited in numbered paragraph 1, supra, further characterized in that the current of the storage cells is raised to a first level during the stand-by state, that subsequently during a read or a write cycle the cell node current is raised to a second level, and then in the recovery phase, for a very short time, to a third level whose magnitude lies between that of the first and the second level.

3. A method of powering a semiconductor store in accordance with the method recited in numbered paragraphs 1 and 2, supra, further characterised in that the read cycle and the write cycle, respectively are subdivided into two phases for the actual reading or writing and for recovery, that as stored information is read, the voltage on the word line is pulled down, so that the two cell nodes of a storage cell are charged, and that at the end of the first phase the corresponding word line is again pulsed up, so that the cell nodes of a storage cell are recharged, that subsequently in the second phase a further current which has decayed under control by the end of the second phase is applied via the two emitters of the load transistors serving as current sources.

4. A circuit arrangement for powering a monolithic storage array in accordance with the method of numbered paragraphs 1, 2 and 3, and wherein the emitters of the flip-flop transistors are connected to the respective word line. The circuit arrangement for practicing the method of powering a monolithic storage array in accordance with numbered paragraphs 1, 2 and 3, supra, further characterized in that to each word line a delay circuit is connected, that the output of each delay circuit is followed by an AND circuit, whose second input is connected to the output of an accurate time circuit which on the input side is connected to each of the word lines via an OR circuit, generating an accurate time pulse which via the AND circuit selected in each case is fed to a connected amplifier linked to the emitters of the load transistors of the storage cells.

5. A circuit arrangement for powering a monolithic storage array in accordance with numbered paragraph 4, and further characterized in that the accurate time circuit is designed as a monostable flip-flop generating a pulse (TSS) for the accurate switching of the AND circuit whose trailing edge is delayed by the delay time of the delay circuit.

The most important, significant and essential advantage of this solution is that by adding a pulse after the actual read or write process, a third current or voltage level is created which rapidly charges the cell nodes and which thus may be very short, whereby stand-by power is reached in a very short time and may be chosen very low in spite of the short cycle time required. In addition, the circuit arrangement for powering a storage in accordance with the method of the invention is relatively inexpensive and thus very suitable for existing storage structures. For each storage chip or array only one accurate time element is required, for example, in the form of a monostable flip-flop and an OR circuit. The delay circuits and the two-input AND circuits are provided only once for each word line.

The foregoing and other objects and features of the invention, method and circuit, will be more apparent from the following more particular description of the preferred embodiments of the invention, as illustrated in the accompanying drawings.

The invention will be described in detail below by way of embodiments shown in the accompanying drawings.

BRIEF DESCRIPTION OF THE DRAWINGS

FIG. 1 discloses a storage cell circuit comprised of bipolar transistors with Schottky diodes as coupling elements and which may be employed to practice the invention.

FIG. 2 comprises FIGS. 2A, 2B and 2C.

FIGS. 2A, 2B and 2C, depict the current distribution inside a representative storage cell at different points in time and in accordance with the invention.

FIG. 3 is a schematic time diagram of the cell current and depicting the three voltage levels employed for powering the store, all in accordance with the invention.

The storage cell depicted in FIG. 1 comprises two NPN flip-flop transistors T1 and T2, whose emitters are jointly connected to a word line WL. The base of each flip-flop transistor T1 and T2, respectively, is connected to the collector of the other transistor. In addition, a Schottky diode SD1 and SD2 respectively, prevent the two flip-flop transistors T1 and T2 from being driven into saturation. The Schottky diodes are respectively connected between the base and the collector of each flip-flop transistor. A current source in the form of a PNP transistor is connected to the collector of each flip-flop transistor T1 or T2 via node A and B, respectively. The emitters of these current sources are connected to a supply line, not shown, which within a storage array is linked to several storage cells of a word line WL. The supply current of the storage cells is controlled via this line, as will be described in detail hereinafter with reference to FIG. 4. Schottky diodes SD3 and SD4, respectively connect node A to bit line B0 and node B to bit line B1. Also represented in FIG. 1 are the detrimental stray capacitances CST. Stray capacitances CST, as illustrated, occur primarily between nodes A and B, respectively, and the substrate potential VS. A fixed reference potential VREF is applied to the bases of the PNP load transistors T3 and T4. The operation of the cell in accordance with FIG. 1, as well as the method in accordance with the invention, will be described below with reference to FIGS. 2 and 3. FIG. 2 depicts the current distribution of the two flip-flop transistors T1 and T2 of the storage cell under different conditions of operation. FIG. 2A depicts the current distribution and the current values in the stand-by state. FIG. 2B depicts the current distribution and the current values during a read, or a write operation. FIG. 2C depicts the current distribution and the current values during the recovery phase. FIG. 3 shows a schematic time diagram of the cell current with three voltage levels and is to be viewed with FIG. 2. In the stand-by phase (time $t1$), the stand-by current IST (FIG. 3) flows into the cell (FIG. 2A) via the load transistors T3 and T4. The load transistors T3 and T4, not shown in FIG. 2, are connected as current sources. It is assumed, for purposes of explanation, that the flip-flop transistor T1 is conductive; in this case both the collector and the base current of T1 is IST/2. Thus, for each memory cell the current IST is discharged via word line WL.

Still referring to FIG. 3, the stand-by phase at the time $t1$ is followed by a read cycle comprising the times $t2$ and $t3$. At the time $t2$ the actual reading is carried out by raising the cell current. As shown in FIG. 2B, in addition to the stand-by current IST, the read current IR from the two bit lines is applied to the cell at this time. Herein, the stand-by current level IST is referred to as the first level and the stand-by current level IST plus the read current IR is referred to as the second level. After the information has been read from the storage cell, the bit line current returns to zero, so that the stand-by level IST is again obtained. While the information was read, the voltage on the word line WL was pulled down. Consequently, the cell nodes A and B were charged to a lower potential. At the end of the time $t2$ the word line WL is again pulsed up and the cell nodes A and B must be recharged. Using only the stand-by current for this purpose would take an unduly long time.

To reduce this time, the stand-by current is raised in the time period $t3$ of FIG. 3 to a level made up of IST + IPU as depicted in FIG. 2C. As depicted in FIG. 3, current IPU has a magnitude which is between that of the read current IR and the stand-by current IST. This increased cell current causes the two storage cell nodes A and B to be rapidly charged. During this process, the current IST + IPU is fed to the emitters of the two current sources T3 and T4 serving as load transistors. The circuit controlling this current is described hereinafter.

As charging of the detrimental capacitances (CST, FIG. 1) by means of this relatively high current takes only a very short time, the pulse employed (FIG. 3) may be very short. The pulse has decayed by the end of the time period t3. Thus, at the end of time period t3, the storage cell again carries the stand-by current IST. The original state of the storage cell is restored.

For the sake of completeness, FIG. 3 also depicts a write cycle which in principle proceeds in the same manner as the read cycle. For this reason, FIG. 2B shows the write currents IWR, as well as the read currents IR, on the bit lines B0 and B1. This obviates the need for a separate circuit diagram. (It is to be expressly understood, as is readily apparent to persons skilled in the art, read currents IR occur only during a memory read cycle, whereas write currents occur only during a memory write cycle). However, it is to be appreciated that depending upon the storage state of the cell, the current (IR or IWR) comes either only from bit line B0 or from bit line B1. Changing the contents (writing) of a storage cell requires a higher current than that necessary for reading information from it. This is shown clearly in FIG. 3 during the time period t6. After completion of the write operation, the write current IWR returns to zero magnitude and during the time period t7 the current IPU is again superimposed on the stand-by current IST. Thus, after completion of the write operation, the storage cell nodes A and B are rapidly charged to a higher potential in the write cycle. At the end of time period t7, there is only the stand-by current IST. The foregoing description discloses the principle and method of the invention. The subsequent description discloses a preferred embodiment of a control circuit which is used to control the storage cell current in a word organized store in practicing the invention.

Figure 4:
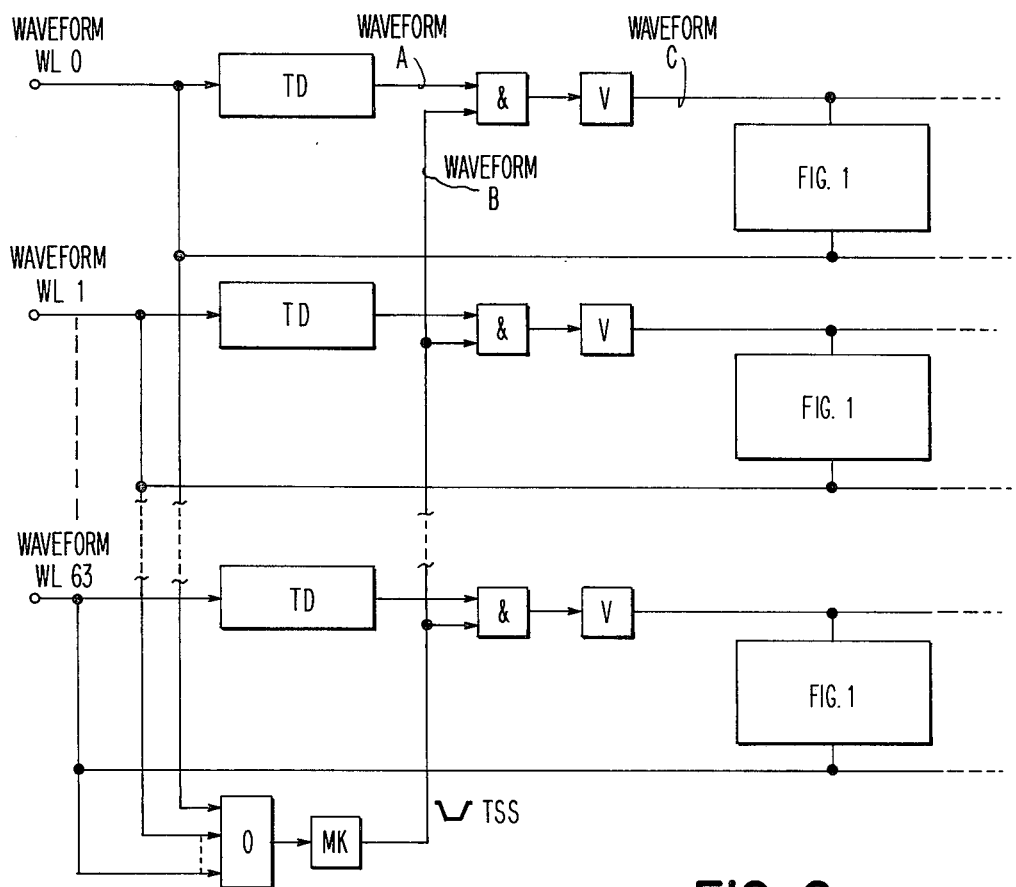
FIG. 4 discloses, in part, a block diagram of a store in accordance with the invention.

In FIG. 4, a limited number of the storage cells of a storage array are represented by the blocks containing the legend "FIG. 1". The emitters of the flip-flop transistors of each storage cell are connected to the associated word line, WL0 through WL63. Only word lines WL0, WL1 and WL63 are expressly shown in FIG. 4. In addition, each word line is connected to a discrete one of 64 delay circuits TD and an OR circuit 0 common to all word lines. The output of common OR circuit 0 is impressed on the input of a monostable flip-flop MK generating the short pulse TSS. The output pulse from the monostable circuit MK is applied to one input of each of the 64 AND circuits &. The second input of each AND circuit & is connected to the output of a predetermined one of the 64 delay circuits TD. The output of each AND circuit & is co nnected to the input of a discrete one of 64 amplifier circuits respectively designated V in FIG. 4. Each amplifier circuit V, one for each Word Line, supplies both the stand-by current IST and the current IPU (see FIG. 2C). As shown in FIG. 4, this current is applied to the emitters of the load transistors T3 and T4 of the storage cells connected to the associated word line.

Figure 5:
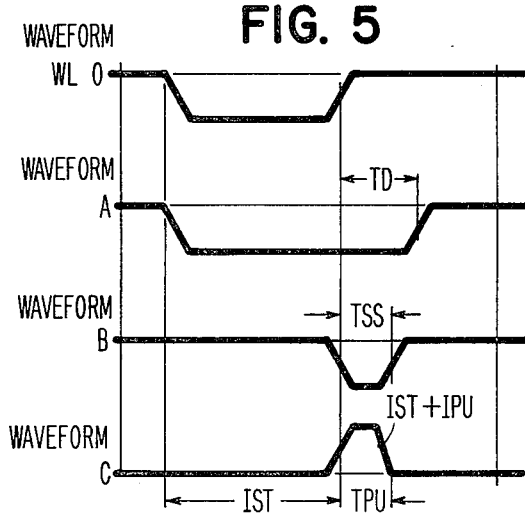
FIG. 5 is a schematic representative time diagram of wave forms describing the circuit arrangements in accordance with FIG. 4.

The operation of the circuit in accordance with FIG. 4 will be described in detail below with reference to the time diagram of the waveforms of FIG. 5. The timing diagram and waveforms of FIG. 5 depict a representative Read cycle in the space between the two outer perpendicular lines. For the sake of completeness, it is pointed out that this time diagram (FIG. 5) could just as well serve to illustrate a write cycle. The first line of the diagram, labeled Waveform WL0, depicts the voltage level on the word line WL0. [For convenience of explanation, in the present example, it is assumed that the word line WL0 has been selected for reading]. Line 2, Waveform A, depicts the output pulse of the delay circuit TD connected to Word Line WL0 as shown in FIG. 4. The third line, Waveform B, depicts the output pulse TSS of the monostable flip-flop MK, as shown in FIG. 4. The fourth line Waveform C, depicts the current waveform on the output of the amplifier V, associated with Word Line WL0, as shown in FIG. 4.

After the word line WL0 has been selected, the signal on this word line controls the corresponding delay circuit TD. This delay circuit then generates the signal represented by Waveform A of FIG. 5. It is pointed out, as shown in FIG. 5, that the trailing edge of the pulse of Waveform A is delayed by the time period TD in relation to the trailing edge of the pulse of Waveform WL0 on the word line WL0.

The delay time period TD of Waveform A, FIG. 5 is relatively uncritical. It must merely be longer in time duration than the output pulse TSS of Waveform B provided by the single shot MK of FIG. 4. The pulse of waveform A, time delay TD, must also have decayed prior to the completion of the read or the write cycle. The trailing edge of the pulse on line WL0, represented in Waveform WL0 of the diagram of FIG. 5, controls the monostable flip-flop MK via the OR circuit 0. It will be apparent from FIG. 4 that only a single OR circuit 0 is required per storage array. The monostable flip-flop MK emits an output pulse TSS, Waveform B, whose duration is accurately defined and which, as described above, is applied to each AND circuit & in the storage array. In the storage array shown in FIG. 4, under the conditions of this illustrative example, the AND condition is satisfied only for the AND circuit & of the word 0 (Word Line WL0) of the array. Thus, only the AND circuit coupled to Word Line WL0 supplies an output pulse IPU + IST in the time TPU of Waveform C. In the present example, the current IPU + IST applies only to one cell. It will be appreciated that for $n$ storage cells coupled to a word line WL the circuit actually supplies the current $n$ (IPU + IST) during the time period TPU of Waveform C. In this connection, it is essential that the time period TSS of Waveform B is shorter than the time period TD of Waveform A. This ensures that a pulse of an accurately defined duration is generated within the time period TPU of Waveform C. This pulse (IST + IPU) is applied directly to the load transistors T3 and T4 of each of the cells on the respective word line WL.

Figure 6:
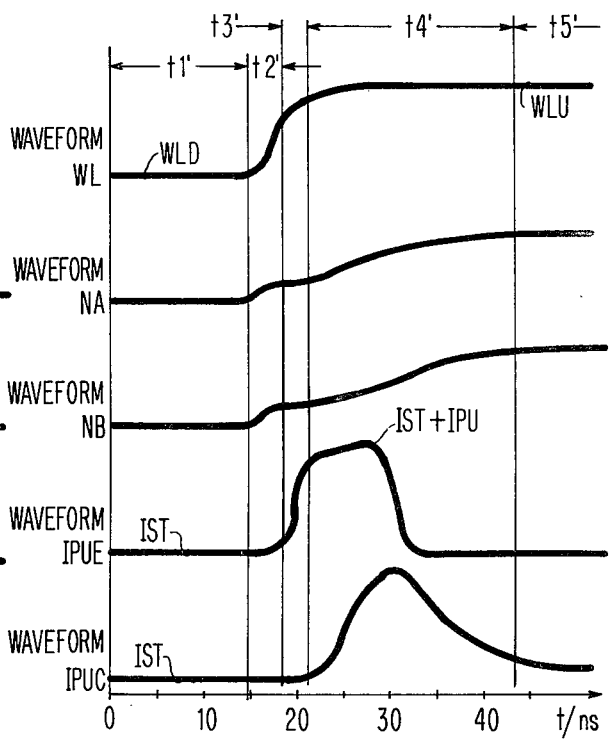
FIG. 6 is a relatively detailed time diagram of waveforms showing the relatively exact times of the phases, the currents on the word lines, on the cell nodes, and on the emitters and collectors of the cell transistors, all in accordance with the invention.

In addition to the voltage on word line WL, the waveforms of FIG. 6 show the voltages on the cell nodes A and B and the currents IPU on the emitter and the collector of the load transistors T3 and T4 of a cell. Waveform WL depicts the voltage on a Word Line WL. Waveform NA depicts the voltage on node A of a storage cell. Waveform NB depicts the voltage on node B of the storage cell. Waveform IPUE depicts the current at the emitters of the load transistors (T3,T4). Waveform IPUC depicts the current at the collectors of the load transistors (T3,T4). By means of this diagram (FIG. 6) the accelerated charging of the cell nodes A and B with the aid of the third storage cell current level added in accordance with the invention is explained in detail for one cell. It is assumed that in the time period t1' the cell is either fully or semi-selected; in any case it is assumed that the storage cell is connected to a selected word line WL. Thus in the time period t1' the voltage of word line WL is at a lower potential. The voltages on the storage cell nodes A and B are also at the lower potential in the time period t1'. For a semi-selected storage cell the storage cell current IST flows in the stand-by state, whereas for a fully selected storage cell this current would be supplemented by the current IR for reading, or IWR for writing. For simplicity's sake, it is assumed that in the present example the storage cell is semi-selected. During the time t2', the potential on word line WL is pulsed from its lower potential WLD to the stand-by potential WLU. During the time period t2' this pulse edge is transferred to the storage cell nodes A and B via the inner transistor capacities, thus causing the potential of both nodes to be raised slightly. As shown by waveforms NA and NB at time period t2' in the diagram of FIG. 6. After this rise in capacity, the storage cell nodes A and B are recharged only by the stand-by current IST in the time period t3', since the current IPUC (Waveform IPUC) does not yet flow in the collectors of the load transistors. Current IPU + IST (Waveform IPUE) already starts to flow in the emitters of the load transistors, rising to its highest level in the time period t4'. During this time period t4', the current IPUE flows into the emitters of the load transistors of the storage cell. This current pulse is shorter in time duration than the timer period t4', whereas on the collectors of these load transistors (T3 T4) a deformed pulse (Waveform IPUC) occurs which reaches its highest level in the time period t4', and effects the actual recharging. The rise of the potentials on storage cell nodes A and B thus is greatest halfway through the time period t4'. At the end of time period t4' the storage cell nodes A and B have reached their stand-by potential. The relatively high current IPU thus caused the potentials on the storage cell nodes A and B to reach their stand-by level very rapidly, so that the write or read cycle obtained is relatively short.

This increased storage cell current is applied only to the selected and also to the semi-selected storage cells in a word line, so that the power dissipation for the storage array is very low. For this example, it is assumed that the stand-by phase occurs in the time period t5'. In this phase only the currents IST flow in the storage cells. It is, of course, also possible to have a new selection phase (read or write) instead.

While the invention has been particularly shown and described with reference to the preferred embodiments thereof, it will be understood by those skilled in the art that various changes in form and details may be made therein without departing from the spirit and scope of the invention.

What is claimed is:

1. In a method of powering a semiconductor storage array wherein the actual flip-flop transistors and the load elements of the storage cell thereof comprise bipolar transistors and wherein the supply voltage is applied in several phases, said method being characterized by the step that (1) a stand-by level current flowing after reading, or writing, in a read, or write cycle subdivided into two phases, is increased for a very short time interval in the cycle by a current increment during a recovery phase of the read, or write cycle, whereby the voltage of the cell node capacitances of the storage cells recover rapidly, and upon termination of said current increment during the recovery phase the current reverts to the stand-by level.

2. In a method in accordance with claim 1, further characterized by the steps that (1) the current of the storage cells is raised to a first level during a stand-by state, (2) subsequently during a read, or a write cycle the cell node current is raised to a second level, and (3) in the recovery phase for said very short time interval the storage cell current is brought to a third level whose magnitude lies between that of said first and second levels.

3. In a method in accordance with claim 2, further characterized in that the read cycle and the write cycle, are respectively, subdivided into two phases, a first phase for the actual reading, or writing, and a second phase for recovery, wherein as stored information is to be read the voltage of the selected word line is pulsed down, whereby the two cell nodes of each storage cell associated with said selected word line are charged, at the end of the first phase the selected word line is pulsed up, whereby the cell nodes of each storage cell associated with said selected word line are recharged, and subsequently in the second phase a further current increment, which has decayed under control by the end of the second phase is applied via the two emitters of the load transistors serving as current sources.

4. In a circuit arrangement for practicing the method, as recited in claim 3, for powering a monolithic storage array, wherein the emitters of each of the flip-flop transistors of each memory cell are connected to a predetermined one of a plurality word lines, characterized in that to each of said plurality of word lines, a discrete delay circuit is connected, that the output of each delay circuit is connected to the first input of a discrete two input AND circuit, that the second inputs of each of said discrete two input AND circuits are connected in common to the output of an accurate time circuit, that the input of the accurate time circuit is connected to the output a multi-input OR circuit, that said multi input OR circuit has a discrete input connected to each of said plurality of word lines, that each of said AND circuits is connected via a discrete amplifier circuit to the load transistors of the memory cells associated with the word line with which said AND circuit is associated.

5. In a circuit arrangement in accordance with claim 4, further characterized in that the accurate time circuit is designed as a monostable flip-flop generating an accurately timed pulse for the accurate switching of the AND circuit associated with a selected word line, said AND circuit of the selected word line being switched by the coincidence of the trailing edge of the pulse from the delay circuit associated with the selected word line and the accurately timed pulse.

6. In a method of powering a semiconductor storage array, wherein the actual flip-flop transistors of the storage cells and the load elements of the storage cells comprise bipolar transistors and the supply current is applied in at least two phases, said method being characterized by inclusion of the following step: a stand-by current flowing in the storage cells immediately after reading, or writing, in a read, or write cycle is increased for a very short time interval by a current increment, whereby the stray capacitance of the storage cells is rapidly recharged to a stand-by potential.

7. In a method in accordance with claim 6, said method being further characterized by inclusion of the following steps: (1) the current of the storage cells is raised to a first level during the stand-by state; (2) subsequently during a read, or a write cycle the cell current is raised to a second level, and (3) in a recovery phase, subsequent to said second level, and for a very short time interval, the cell current is raised to a third level whose magnitude lies between that of the first and the second levels.

8. In a method in accordance with claim 7, said method being further characterized as follows: (1) the read cycle and the write cycle are respectively subdivided into two phases for the actual reading, or writing, and for recovery; (2) that as stored information is read, the voltage on the word line is pulled down; (3) that at the end of the first phase the word line is pulsed up, so that the stray capacitance of the storage cells are recharged; and (4) that subsequently in the second phase a further current, which decays under control by the end of the second phase, is applied via the two emitters of the load transistors serving as current sources of each of the storage cells, whereby the stray capacitance of the storage cells is rapidly brought to stand-by potential.

9. A circuit arrangement for powering a storage array having a plurality of word lines and a plurality of storage cells associated with each word line, wherein the emitters of the flip-flop transistors of each of the storage cells are connected to a predetermined one of said plurality of word lines, each of said storage cells including in addition to said flip-flop transistors first and second load transistors, said circuit arrangement being characterized as follows: that to each word line a delay circuit is connected; that the output of each delay circuit is followed by a two input AND circuit, whose second of said two inputs is connected to the output of an accurate time circuit; that the output of each AND circuit is connected via a discrete amplifier circuit to the emitters of the load transistors of storage cells associated with the word line with which said AND circuit is associated; that the input of the accurate time circuit is connected to each of the word lines via an OR circuit, whereby upon selection of a word line the single shot generates an accurately timed pulse which via the AND circuit selected in a read, or write cycle is fed to the connected amplifier circuit linked to the emitters of the load transistors of the storage cells selected.

10. A circuit arrangement in accordance with claim 9, further characterized in that the accurate time circuit is a monostable flip-flop generating the pulse for the accurate switching of the selected AND circuit.

11. In a monolithic storage array circuit having one through $n$ groups of storage cells, each storage cell having first and second cross coupled bipolar flip-flop transistors and first and second collector loads said monolithic storage array circuit including:
  $n$ word lines, each of said word lines being directly connected to the bi-polar flip-flop transistors of the storage cells of a predetermined one of said $n$ groups of storage cells;
  $n$ like additional circuit means, each of said $n$ like additional circuit means being connected between one of said word lines and the first and second collector loads of each of the group of storage cells connected to the word line to which the particular one of said $n$ like additional circuit means is connected;
  and control means coupled between said $n$ word lines and said $n$ additional circuit means, said control means activating and controlling the one of said additional circuit means corresponding to a selected word line during a read cycle, or a write cycle, to more rapidly return the storage cells associated with a selected word line, subsequent to a read cycle, or write cycle, to a stand-by state.

12. In a monolithic storage array circuit, as recited in claim 11, wherein said first and second collector loads are respectively bi-polar load transistors of a first conductive type and said first and second bi-polar flip-flop transistors are respectively of a second conductive type opposite to said first conductivity type.

13. In a monolithic storage array circuit, as recited in claim 12, wherein each of said $n$ like additional circuit means comprises:
  a delay circuit having an input connected to a predetermined one of said $n$ word lines and an output;
  a two input AND circuit having a first input connected to said output of said delay circuit, a second input connected to said control means, and an output;
  an amplifier means having an input connected to said output of said AND circuit, and an output connected in common to each of said bi-polar load transistors of each storage cell of a predetermined one of said $n$ groups of storage cells.

14. In a monolithic storage array circuit, as recited in claim 13, wherein said control means comprises:
  an input OR circuit means having a discrete input connected to each of said $n$ word lines, and an output;
  a single shot circuit having an input connected to said output of said OR circuit means and an output connected in common to said second input of each of said AND circuits of said $n$ like additional circuit means.

15. In a monolithic storage array circuit, as recited in claim 14, wherein each of said storage cells of said $n$ groups of storage cells comprises:
  first and second PNP bi-polar load transistors each having an emitter, base and collector;
  first and second cross coupled NPN flip-flop transistors, each having an emitter, base and collector;
  first connection means connecting in common said emitters of said PNP load transistors and the output of a predetermined one of said $n$ amplifier means;
  a reference potential connected in common to said bases of said first and second PNP load transistors;
  second connection means connecting in common said collector of said first PNP load transistor, said collector of said first NPN flip-flop transistor and said base of said second NPN flip-flop transistor;
  third connection means connecting in common said collector of said second PNP load transistor, said collector of said second NPN flip-flop transistor and said base of said first NPN flip-flop transistor;
  and fourth connection means connecting in common said emitters of said first and second NPN flip-flop trasistors and a predetermined one of said $n$ word lines, said predetermined one of said $n$ word lines corresponding to the one of said $n$ like additional means including the afore recited predetermined one of said $n$ amplifier means;
  a first Schottky barrier diode connected between said base and collector of said first NPN flip-flop transistor;
  and a second Schottky barrier diode connected between said base and collector of said second NPN flip-flop transistor.

16. In a monolithic storage array circuit as recited in claim 15 wherein said storage array circuit includes $n$ pairs of bit lines, each pair of bit lines including a first bit line and a second bit line, and where each storage cell of said $n$ groups of storage cells is coupled by coupling means to a predetermined pair of said $n$ pairs of bit lines, said coupling means comprising a third Schottky barrier diode connected between said first bit line of said predetermined pair and said first connected means, and a fourth Schottky barrier diode connected between said second bit line of said predetermined pair and second second connection means.

* * * * *

UNITED STATES PATENT OFFICE
CERTIFICATE OF CORRECTION

PATENT NO. : 4,070,656
DATED : January 24, 1978
INVENTOR(S) : K. Heuber, W. Klein, K. Najmann & S. K. Wiedmann It is certified that error appears in the above-identified patent and that said Letters Patent are hereby corrected as shown below:

| | |
|---|---|
| Col. 2, line 64 | Serial No. "620,590" should read ----620,690--. |
| Col. 4, line 13 | Serial No. "622,309" should read----662,309--. |
| Col. 9, line 59 | "cell" should read --cells--. |
| Col. 12, line 58 | "trasistors" should read --transistors--. |
| Col. 14, line 2 | "connected" should read --connection--. |
| Col. 14, line 4 | "second" (second occurrence) should read --said--. |

Signed and Sealed this

Fifteenth Day of May 1979

[SEAL]

Attest:

RUTH C. MASON
Attesting Officer

DONALD W. BANNER
Commissioner of Patents and Trademarks